(12) United States Patent
Choi et al.

(10) Patent No.: US 11,513,459 B2
(45) Date of Patent: Nov. 29, 2022

(54) POWER SUPPLY APPARATUS FOR SELECTIVELY CHANGING POWER AMPLIFICATION METHOD BASED ON POWER MODE OF IMAGE FORMING DEVICE

(71) Applicant: Hewlett-Packard Development Company, L.P., Spring, TX (US)

(72) Inventors: Sung Kyu Choi, Suwon (KR); An Sik Jeong, Pangyo (KR)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 17/415,093

(22) PCT Filed: Aug. 24, 2020

(86) PCT No.: PCT/US2020/047646
§ 371 (c)(1),
(2) Date: Jun. 17, 2021

(87) PCT Pub. No.: WO2021/045923
PCT Pub. Date: Mar. 11, 2021

(65) Prior Publication Data
US 2022/0187749 A1    Jun. 16, 2022

(30) Foreign Application Priority Data
Sep. 2, 2019    (KR) .......................... 10-2019-0107992

(51) Int. Cl.
  *G03G 15/00*    (2006.01)
  *H02M 1/00*    (2006.01)
  *H02J 9/00*    (2006.01)

(52) U.S. Cl.
  CPC .......... *G03G 15/5004* (2013.01); *G03G 15/80* (2013.01); *H02J 9/005* (2013.01); *H02M 1/0032* (2021.05)

(58) Field of Classification Search
CPC . G03G 15/5004; G03G 15/80; H02M 1/0032; H02M 1/0058; H02M 1/007;
(Continued)

(56) References Cited

U.S. PATENT DOCUMENTS 6,327,161 B1    12/2001    Chen
8,280,272 B2    10/2012    Kim
(Continued)

FOREIGN PATENT DOCUMENTS

JP    20030009535    1/2003
JP    20060238602    9/2006
KR    101330639    11/2013

*Primary Examiner* — Sophia S Chen
(74) *Attorney, Agent, or Firm* — Staas & Halsey LLP (57) ABSTRACT

A power supply apparatus to supply power to an image forming device, the power supply apparatus includes an amplifier to amplify an input AC power by a general amplification or a double amplification, a converter to receipt the input AC power amplified by the general amplification or the double amplification and output a DC power with a determined size. A controller control applying the general amplification or the double amplification to the converter, in response to an operating mode of the image forming device.

15 Claims, 8 Drawing Sheets

(58) Field of Classification Search
CPC ...... H02M 1/008; H02M 3/285; H02M 3/335; H02M 7/06; Y02B 70/10; Y02B 70/30; Y04S 20/20; H03F 1/0277; H03F 3/005; H03F 3/085; G01R 19/175; H02J 9/005; H04N 1/00885
See application file for complete search history.

(56) References Cited

U.S. PATENT DOCUMENTS

| | | |
|---|---|---|
| 8,803,038 B2 | 8/2014 | Nakazawa et al. |
| 8,901,780 B2 | 12/2014 | Tsuda |
| 8,909,964 B2 | 12/2014 | Narushima et al. |
| 9,122,224 B2 | 9/2015 | Sato |
| 9,547,362 B2 | 1/2017 | Oh |
| 2016/0238983 A1* | 8/2016 | Hirabayashi ........... G03G 15/80 |
| 2018/0275592 A1* | 9/2018 | Shimazoe .............. G03G 15/80 |
| 2020/0192269 A1* | 6/2020 | Tamaki ................. G03G 15/80 |

* cited by examiner

POWER SUPPLY APPARATUS FOR SELECTIVELY CHANGING POWER AMPLIFICATION METHOD BASED ON POWER MODE OF IMAGE FORMING DEVICE

BACKGROUND

An image forming device is an apparatus which performs generation, printing, reception, and transmission of image data, and representative examples thereof may be a printer, a scanner, a copier, a facsimile, and a multifunction peripheral (MFP) in which functions of the above-described devices are combined.

Such image forming device is provided with a power supply apparatus for supplying power required for each component inside the image forming device.

DETAILED DESCRIPTION

Hereinafter, examples will now be described in detail with reference to the accompanying drawings. The examples of the disclosure may vary, and may be provided in different examples. In order to describe examples in more detail, detailed description regarding a known technology for those skilled in the art will be omitted.

On the other hand, the term "connected to" or "coupled to" that is used to designate a connection or coupling of one element to another element includes both a case that an element is "directly connected or coupled to" another element and a case that an element is connected or coupled to another element via still another element. Further, it should be understood that the term "includes" means that other constituent elements may be further included rather than excluding the other constituent elements unless specially mentioned on the contrary.

An "image forming job" in the disclosure may refer to various jobs (e.g., printing, scanning or faxing) related to an image, such as forming an image or generating/storing/transmitting, etc. an image, and the "job" may not only refer to an image forming job, but also include a series of processes for performing an image forming job.

An "image forming device" may refer to an apparatus that prints printing data generated at a terminal apparatus, like a computer, on recording medium. As examples of such an image forming apparatus, there is a copier, a printer, a facsimile or multi-function printer (MFP) that multiply implement the functions of the aforementioned apparatuses through one apparatus, etc.

Further, the term "print data" may mean data that is converted into a printable format in a printer. On the other hand, if the printer supports direct printing, the file itself may become the print data.

Figure 1:
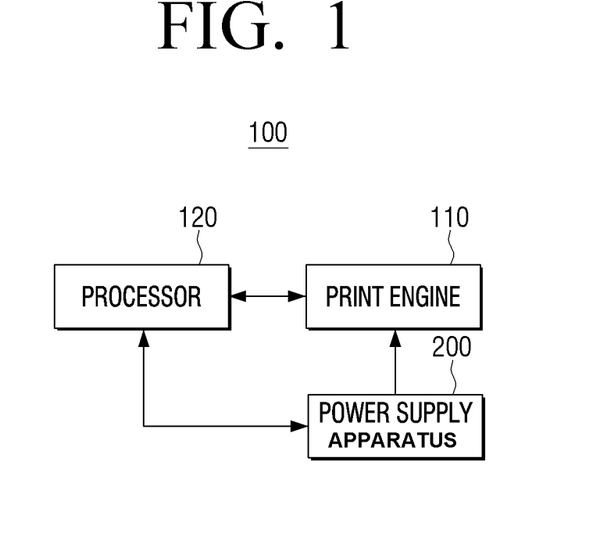
FIG. 1 is a block diagram illustrating a configuration of an image forming device according to an example.

FIG. 1 is a block diagram illustrating a configuration of an image forming device according to an example.

Referring to FIG. 1, the image forming device 100 includes a print engine 110, a processor 120, and a power supply apparatus 200

The print engine 110 may print out print data. The print engine 110 may form an image on a recording medium (e.g., paper) by various printing methods such as an electrophotographic method, an inkjet method, a thermal transfer method, and a thermal method. For example, the print engine 110 may print an image on a recording medium by a series of processes including exposure, developing, transfer and fixing.

The processor 120 controls each component of the image forming device 100. For example, the processor 120 may be implemented by a central processing unit (CPU), an application specific integrated circuit (ASIC), or the like, and may determine an operating mode of the image forming device 100.

For example, the image forming device 100 may determine changing from a power saving mode to a normal state when a soft switch is pressed or print data is received. In more detail, when the soft switch is pressed in the power saving mode and a reset signal is input to the processor 120 to perform an initial booting operation, the processor 120 may determine that a transition to the normal state is required.

Further, if the print data is received, the processor 120 may control the print engine 110 to generate binary data through performing of processes, such as parsing, of the received print data and to print the generated binary data.

The processor 120 may determine an operating mode of the image forming device 100 as a power saving mode when printing is completed and a predetermined time passes. In addition, the processor 120 may control the power supply apparatus 200 to supply power corresponding to the power saving mode. The power saving mode refers to a state in which the power supply apparatus 200, which will be described later, does not perform double amplification and does not output a second direct current (DC) power. Meanwhile, for ease of explanation, an example of the disclosure has described that the image forming device 100 has only a full mode or a normal mode, but the image forming device 100 may have a more detailed operation mode during implementation.

The processor 120 may provide information on the operating mode of the image forming device 100 as described above to the power supply apparatus 200. For example, the processor 120 may provide information to the power supply apparatus 200 only when the operating mode is switched, and periodically or continuously provide information on the operating mode of the image forming device 100 to the power supply apparatus 200.

The power supply apparatus 200 may supply power to each component of the image forming device 100. For example, when the operating mode of the image forming device 100 is a normal mode, the power supply apparatus 200 may perform the double amplification to generate a first DC power supply (e.g., a 5V DC power supply) and a second DC power supply (e.g., a 24V DC power supply). In addition, the power supply apparatus 200 may provide each of the generated first DC power and the second DC power to a corresponding component in the image forming device 100. For example, the power supply apparatus may provide the first DC power to the processor 120 and the second DC power to the print engine 110. Meanwhile, the print engine 110 may be provided with not only the second DC power but also the first DC power during implementation, and may also be provided with an alternating current (AC) power for operating a fusing device.

When an operating mode of the image forming device 100 is a power saving mode, the power supply apparatus 200 may only perform an operation of a general amplification to generate the first DC power, and may provide the generated first DC power only to a composition (e.g., the processor 120) that operates in the power saving mode. Specific composition and operation of the power supply apparatus 200 will be described below by referring to FIG. 3.

The power supply apparatus 200 may detect whether AC power is being applied and provide the detected information to the processor 120.

In addition, the power supply apparatus 200 may detect a zero-cross time of the AC power and provide the detected zero-cross time to any one of the processor 120 or the print engine 110. Based on the zero-cross time, the processor 120 or the print engine 110 may control a heating operation of the fusing device.

On the other hand, although an example configuration that constitutes the image forming device has been illustrated and described, various configurations may be additionally provided during implementation. This will be described hereinafter with reference to FIG. 2.

Figure 2:
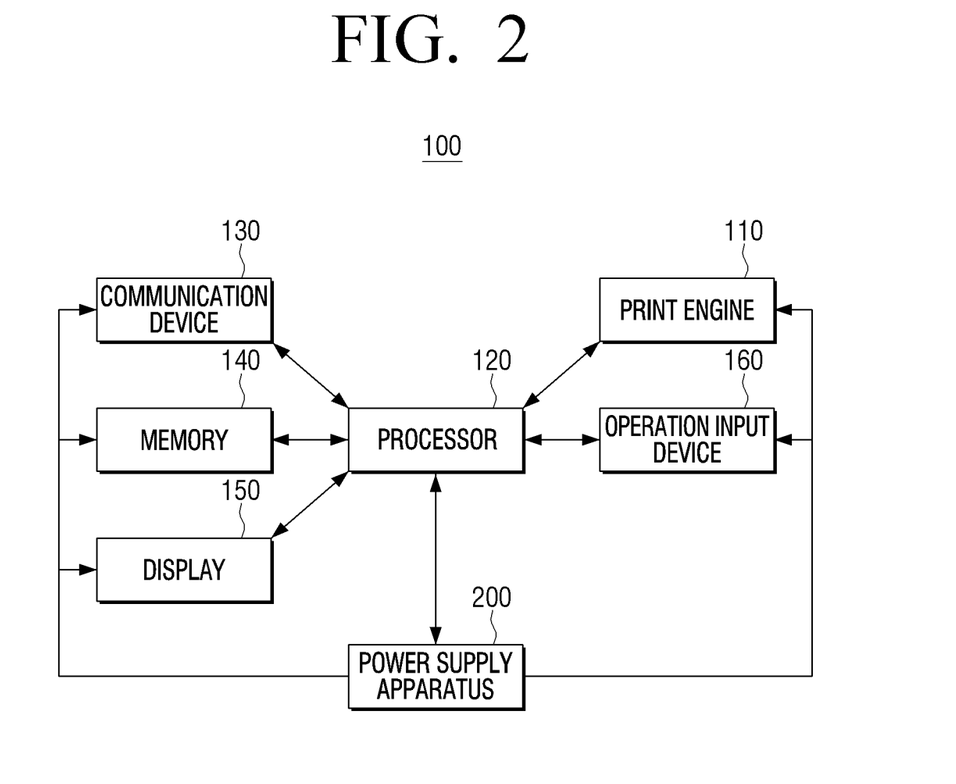
FIG. 2 is a block diagram illustrating a detailed configuration of an image forming device according to an example.

FIG. 2 is a block diagram illustrating a detailed configuration of an image forming device according to an example.

Referring to FIG. 2, the image forming device 100 may include a print engine 110, a processor 120, a communication device 130, a memory 140, a display 150, an operation input device 60 and a power supply apparatus 200.

Configurations of the print engine 110, the processor 120, and the power supply apparatus 200 are the same as a configuration of FIG. 1, repeated descriptions thereof will be omitted.

The communication device 130 may be connected to a terminal device (not shown), such as a mobile device (smartphone, tablet PC, etc.), a personal computer (PC), a laptop PC, a personal digital assistant (PDA), a digital camera, or the like, and receive files and print data from the terminal device (not shown). For example, the communication device 130 may be formed to connect the image forming device 100 to an external device, and be connected to the terminal device through not only a local area network (LAN) and an internet network, but also a universal serial bus (USB) port, or wireless communication (e.g., Wi-Fi 802.11a/b/g/n, near filed communication (NFC), Bluetooth) port.

Since the communication device 130 should be operated even in the power saving mode, it may be continuously provided with the first DC power through the power supply apparatus 200 even in the power saving mode. In addition, when print data is received through the communication device 130 while an operating mode of the image forming device 100 is in the power saving mode, the processor 120 may change the operating mode of the image forming device 100 from the power saving mode to a normal mode.

The memory 140 may store print data received through the communication device 130. The memory 140 may be implemented by a storage medium and an external storage medium in the image forming device 100, such as a removable disk including a USB memory, a storage medium connected to a host, a web server through a network, or the like.

The memory 140 may operate in a power saving mode or may not operate. For example, a refresh operation should be performed to maintain data in case of volatile memory, and thus, a first DC power may be continuously provided through the power supply apparatus 200 even in the power saving mode. In contrast, power supplied to the memory 140 may be cut off in case of nonvolatile memory or in an environment where data of the volatile memory can be transferred to the nonvolatile memory.

The display 150 may display various information provided from the image forming device 100. For example, the display 150 may display a user interface window for selecting various functions provided in the image forming device 100. The display 150 may be a monitor, such as a liquid crystal display (LCD), a cathode-ray tube (CRT), organic light emitting diodes (OLED), or the like, and may be implemented by a touch screen that can simultaneously perform a function of an operation input device 160 which will be described later.

The operation input device 160 may receive an input of user's function selection and a control command for the corresponding function. The function may include printing, copying, scanning, fax transmission, and the like. The operation input device 160 as described above may be input through a control menu that is displayed on the display 150.

The operation input device 160 may be implemented by a plurality of buttons, a keyboard, and a mouse, and may also be implemented by a touch screen that can simultaneously perform the function of the display 150.

In addition, the operation input device 160 may include a power button for changing an operation mode of the image forming device 100, and the image forming device 100 may be switched to a power saving mode from a normal state according to the operation of the power button. Since the power button should be operated even in the power saving mode, the operation input device 160 may be provided with power from the power supply apparatus 200 even when the operating mode is a power saving mode.

As described above, the image forming device 100 according to an example may prevent the power supply apparatus from performing double amplification in the power saving mode, thereby reducing power consumption generated by the power supply apparatus 200 in the power saving mode.

Meanwhile, FIGS. 1 and 2 illustrate and describe that the power supply apparatus 200 is included in the image forming device 100, but the power supply apparatus 200 may be implemented as a separate device.

In addition, although FIGS. 1 and 2 illustrate and describe only general function of the image forming device 100, not only the above-described configuration but also a scanning device that performs a scanning function and a fax transmitting/receiving device that performs a fax transmitting/receiving function may be provided according to a function supported by the image forming device 100. In addition, although it has been illustrated and described that a print engine is basically included in the image forming device 100, when the image forming device 100 is a scanner, the scanning device may be included instead of the print engine.

Figure 3:
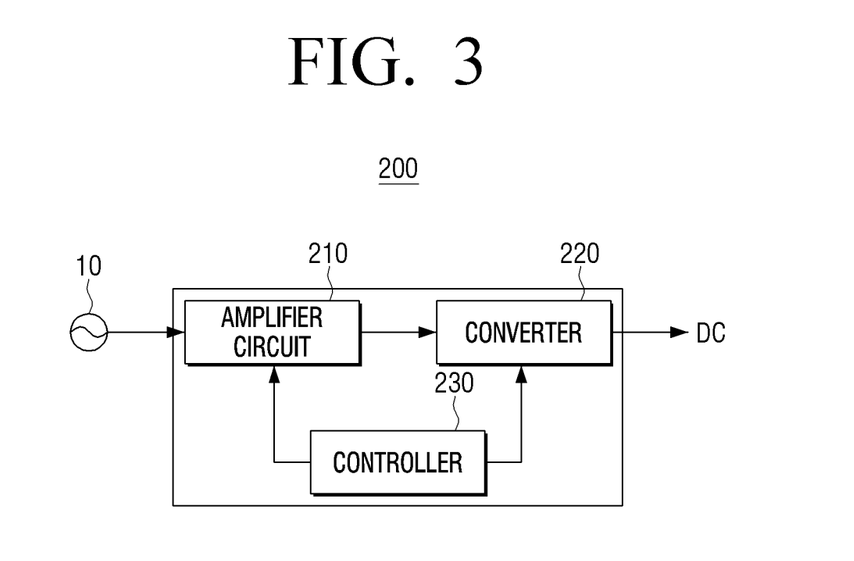
FIG. 3 is a block diagram illustrating a configuration of a power supply apparatus of FIG. 1.

FIG. 3 is a block diagram illustrating a configuration of a power supply apparatus of FIG. 1.

Referring to FIG. 3, the power supply apparatus 200 may include an amplifier circuit 210, a converter 220 and a controller 230.

The amplifier circuit 210 may amplify an input AC power 10 by general amplification, or double amplification. For example, the amplifier circuit 210 may perform the double amplification when an operating mode of the image forming device 100 is in a normal mode, and may not perform the double amplification when the operating mode of the image forming device 100 is in a power saving mode. That is, the amplifier circuit 210 may perform only the general amplification when the operating mode of the image forming device 100 is in the power saving mode.

The AC power 10 may be an 110V AC power used in the United States, Japan or the like. Voltage output from the amplifier circuit 210 during the double amplification may be approximately 310V, and voltage output from the amplifier circuit 210 during a general amplification may be approximately 155V.

The amplifier circuit 210 for operating as described above may be implemented in various ways, such as a method of combining a single double amplifier circuit and a switch, and a method of using a double amplifier circuit and a general amplifier circuit in parallel may be used. An amplifier circuit using the single double amplifier circuit and the switch will be described with reference to FIGS. 4, and 5, and an amplifier circuit in which the general amplifier circuit and the double amplifier are connected in parallel will be described later with reference to FIGS. 6 and 7. The amplifier circuit 210 may be referred to as an AC/DC converter in that it outputs an input alternating current to a direct current power.

The converter 220 may receive power amplified from the amplifier circuit 210 and output a DC power with a predetermined size. The converter 220 may use various converters such as a flyback converter, a buck-boost converter, an LLC resonant converter, or the like. The converter 220 may be referred to as a DC/DC converter in that a size of the DC power varies.

In addition, the converter 220 may output a single DC power or may output a plurality of DC power having different sizes. A case in which the converter 220 outputs two DC powers having different sizes will be described later with reference to FIG. 4.

The controller 230 may control the amplifier circuit 210 so that the amplifier circuit may selectively perform an operation of a double amplification based on an operating mode of the image forming device. For example, the controller 230 may control the amplifier circuit 210 to perform the operation of the double amplification when the operating mode is a normal mode, and control the amplifier circuit 210 not to perform the operation of the double amplification when the operating mode of the image forming device is a power saving mode.

The controller 230 may identify an input of the AC power and check the zero-cross time of the AC power. In addition, the controller 230 may provide information regarding whether the identified AC power is input and information on the zero-cross time to the processor 120.

As described above, the power supply apparatus 200 according to an example does not perform the operation of the double amplification in the power saving mode, but performs an operation of a general amplification, thereby further reducing power consumption in the power saving mode. In addition, the power supply apparatus 200 performs the operation of the double amplification in the normal mode, so that a converter of a power supply apparatus that operates in a region of relatively high voltage (e.g., commercial use 200V) may be commonly used.

On the other hand, although only an example configuration that constitutes the power supply apparatus has been illustrated and described, various configurations may be additionally provided during implementation. Further explanation is provided below with reference to FIGS. 4 and 5.

Figure 4:
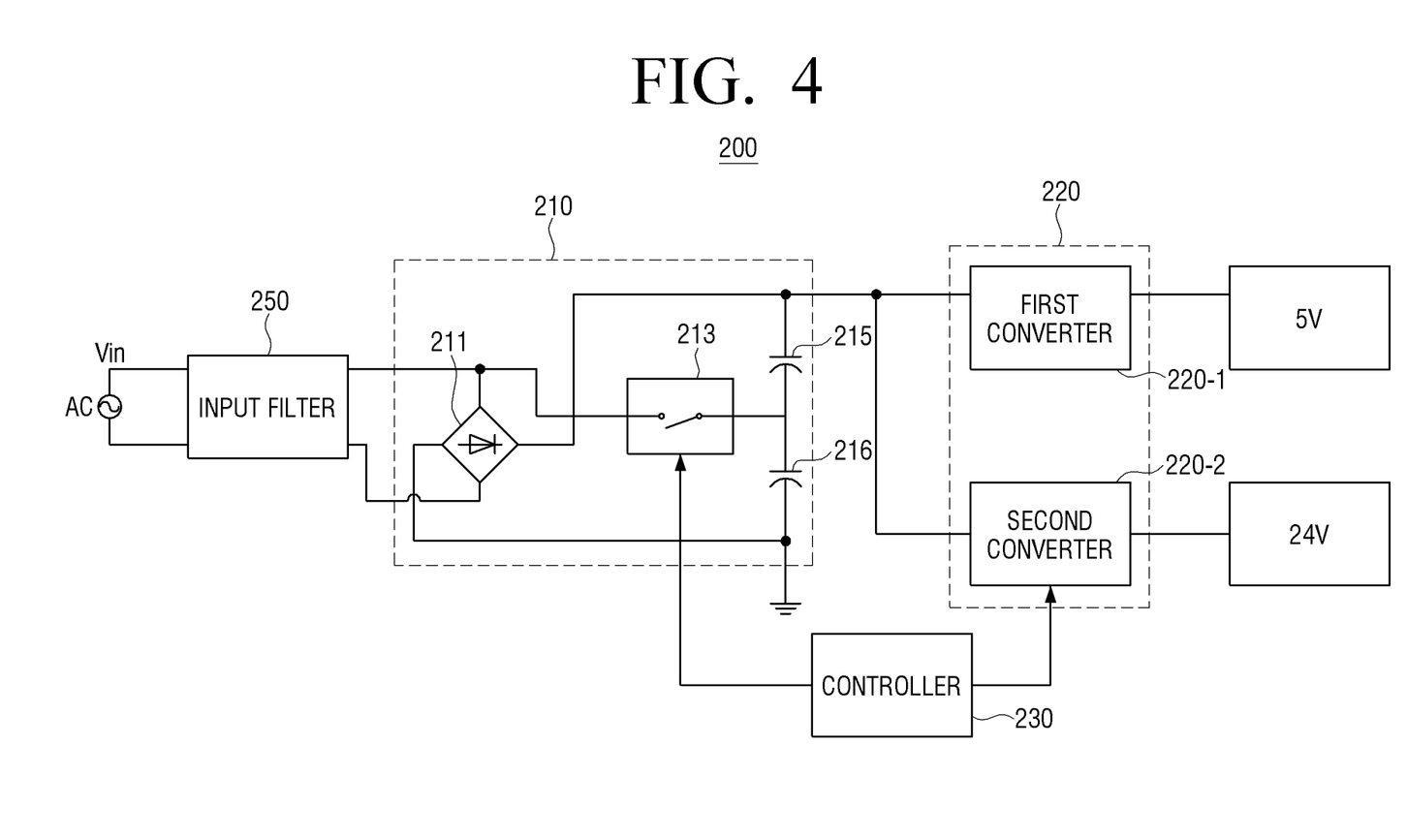
FIG. 4 is a block diagram illustrating a configuration of a power supply apparatus according to a first example.

FIG. 4 is a block diagram illustrating a configuration of a power supply apparatus according to a first example. For example, the power supply apparatus according to first example uses an amplifier circuit in which a switch is added to a double amplifier.

Referring to FIG. 4, the power supply apparatus 200 may include an input filter 250, an amplifier circuit 210, a converter 220 and a controller 230.

The input filter 250 may receive a commercial AC power (e.g., 110V) and remove a harmonic signal in the commercial AC power. The detailed configuration and operation of the input filter 250 will be described later with reference to FIG. 5.

The amplifier circuit 210 may amplify, by double amplification, or by general amplification, the power output from the input filter 250. For example, the amplifier circuit 210 may include a rectifier circuit 211, a first switch 213, a first capacitor 215 and a second capacitor 216.

The rectifier circuit 211 may be configured as a bridge circuit in which a plurality of diodes have a bridge shape, and may receive power output from the input filter 250 through an input terminal to output the rectified power through an output terminal. For example, a first input terminal of the rectifier circuit 211 may be commonly connected to a first output terminal of the input filter 250 and one end of the first switch 213, and a second input terminal of the rectifier circuit 211 may be connected to a second output terminal of the input filter 250. The first output terminal of the rectifier circuit 211 may be connected to one end of the first capacitor 215, and the second output terminal of the rectifier circuit 211 may be connected to the second end of the second capacitor 216.

The first switch 213 may selectively connect intermediate nodes of the first and second capacitors 215 and 216 to the first input terminal of the rectifier circuit 211. For example, one or first end of the first switch 213 may be commonly connected to the first input terminal of the rectifier circuit 211 and the first output terminal of the input filter 250, and the other or second end of the first switch 213 may be connected to the intermediate nodes connected in series of the first and second capacitors 215 and 216. The first switch 213 may be an electronic relay (e.g., a solid state relay (SSR)) or a power transistor (e.g., Metal Oxide Semiconductor Field Effect Transistor (MOSFET)).

The first and second capacitors may be connected in series. For example, one or first end of the first capacitor 215 may be connected to the first output terminal of the rectifier circuit 211, and the other or second end of the first capacitor 215 may be commonly connected to the other or second end of the first switch 213 and to one or first end of the second capacitor 216.

In addition, the one or first end of the second capacitor 216 may be commonly connected to the other or second end of the first switch 213 and to the second end of the first capacitor 215, and the other or second end of the second capacitor 216 may be connected to the second output terminal of the rectifier circuit 211.

The converter 220 may output a first DC power and a second DC power, and may include a first converter 220-1 outputting the first DC power and a second converter 220-2 outputting the second DC power. The first DC power may be a 5V DC power and the second DC power may be a 24V DC power.

The first converter 220-1 may receive power amplified by the amplifier circuit 210 and output the first DC power with a predetermined size. The first converter 220-1 may be implemented as a flyback converter, but is not limited thereto.

The second converter 220-2 may receive power amplified by the amplifier circuit 210 and output the second DC power with a predetermined size larger than the first DC power. The second converter 220-2 may be implemented as an LLC resonant converter, but is not limited thereto.

The controller 230 may control the first switch 213 to short when an operating mode of the image forming device 100 is a normal mode, and may control the first switch 213 to open when the operating mode of the image forming device 100 is a power saving mode. In addition, the controller may control the second converter 220-2 to stop the operation of the second converter 220-2 when the operating mode of the image forming device 100 is a power saving mode.

Hereinafter, an operation of the power supply apparatus 200 according to the operating mode of the image forming device 100 will be described separately.

When the operating mode of the image forming device 100 is a normal mode, the controller 230 may allow the first switch 213 to be short-circuited, and both the first converter 220-1 and the second converter 220-2 to be operated.

As described above, when the first switch 213 is short-circuited, the amplifier circuit 210 may have the same equivalent circuit as that of a general double amplifier circuit, and may perform a double amplifying operation for the input AC current to output the double amplified power. Since the input AC power is output through a rectifier circuit 211 and capacitors 215 and 216, that is, the AC power is rectified and smoothed to be output, the double amplified power is a DC power.

When the double amplified power is output as described above, the first converter 220-1 may output a first DC power (e.g., 5V0) with a predetermined size through a pulse width modulation (PWM) switching.

In addition, the second converter 220-2 may use the input double amplified power to output the second DC power (e.g., 24V) with a predetermined size.

Meanwhile, when the operating mode of the image forming device 100 is changed from a normal mode to a power saving mode, the controller 230 may stop the operation of the second converter 220-2. Accordingly, the converter 220 may output the first DC power only.

Thereafter, the controller 230 may open the first switch 213. When the first switch 213 is opened as described above, the amplifier circuit 210 may have the same equivalent circuit as that of a general general-amplifier circuit, and thus may perform a general amplifying operation on the input AC power.

When the general amplifying operation is performed as described above, the first converter 220-1 may use an input power having a low voltage size to output the first DC power (e.g., 5V) with a predetermined size.

Meanwhile, although a size of the power input to the first converter 220-1 may be reduced by about half as compared with the double amplification, so that the first converter 220-1 may use half of a size of the input power, the first converter 220-1 has no difficulty in outputting the first DC power, in that the image forming device 100 is in a state in which a load size may be reduced (that is, a no-load state) even when changed to the power saving mode.

In particular, since a power input to the first converter 220-1 may be reduced by half, the power consumed by a resistor in the first converter 220-1 may be reduced to about one quarter. Accordingly, the power supply apparatus 200 according to the disclosure may operate in the same performance as a 1 W input power saving mode method in the normal mode, and further reduce power consumption in the power saving mode than a 1 W input power saving mode method.

Meanwhile, although only an example configuration that constitutes the power supply apparatus has been illustrated and described, various configurations may be additionally provided during implementation. This will be described below with reference to FIG. 5.

Figure 5:
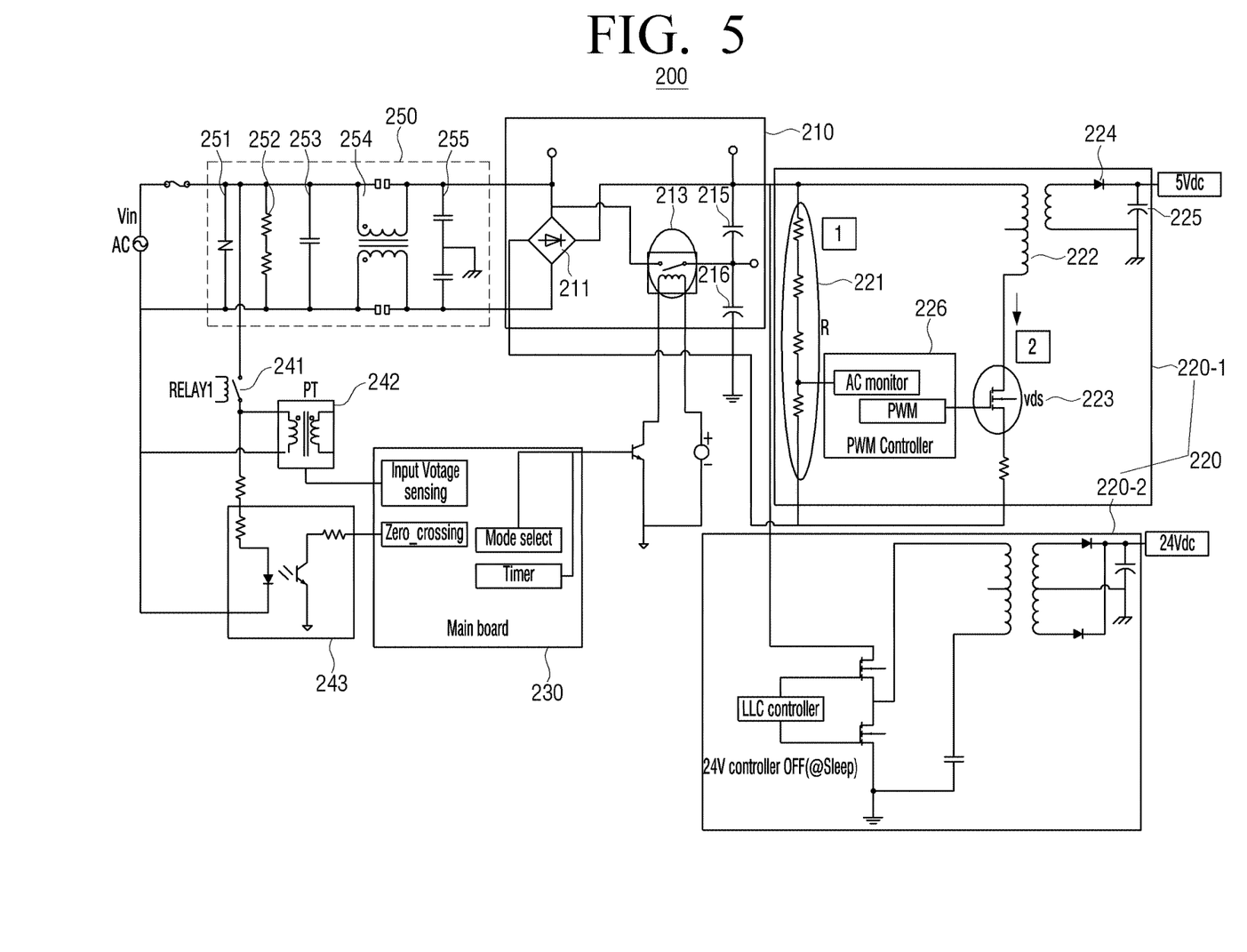
FIG. 5 is a circuit diagram illustrating a power supply apparatus according to a first example.

FIG. 5 is a circuit diagram illustrating a power supply apparatus according to a first example.

Referring to FIG. 5, the power supply apparatus 200 may include an input filter 250, an amplifier circuit 210, a converter 220, a controller 230, a fourth switch 241, an AC sensing circuit 242, and a zero-cross sensing circuit 243.

The input filter 250 may receive AC power. For example, the input filter 250 may receive a general commercial AC power (e.g., 110V, 60 Hz). The input filter 250 may include a varistor 251, a resister circuit 252, an X-capacitor 253, a harmonic filter 254, and a Y-capacitor 255.

The varistor 251 is connected in parallel to the AC power and may protect an instantaneous overvoltage of the AC power flowing into the power supply apparatus 200.

The register circuit 252 is connected in parallel to the input AC power, and may discharge power in an interelement when a power cable of the power supply apparatus 200 is disconnected.

The X-capacitor 253 is connected in parallel with the input AC power, and may block an EMI.

The harmonic filter 254 is connected in parallel with the input AC power, and may remove the harmonic signal from the input AC power.

The Y-capacitor 255 is connected to the harmonic filter 254 and may block the EMI.

Specific configurations and operations of the amplifier circuit 210 are the same as those of the amplifier circuit 210 of FIG. 4, and repeated descriptions thereof are not provided.

The first converter 220-1 is a flyback converter and may include a plurality of resistors 221, the transformer 222, a second switch 223, a diode 224, a third capacitor 225 and a PWM controller 226.

The plurality of resistors 221 may be connected in parallel to the output terminal of the amplifier circuit 210. For example, one or first end of the plurality of resistors 221 may be commonly connected to the first output terminal of the amplifier circuit 210 and one or first end of a first winding of a transformer 222, and the other or second end of the plurality of resisters 221 may be connected to the second output terminal of the amplifier circuit 210. In addition, the plurality of resisters 221 may distribute the amplified voltage and provide the distributed voltage to the PWM controller 226.

The transformer 222 may have the first and second windings wound at a predetermined winding ratio, and may transform a power applied to the first winding to output to the second winding. For example, the first end of the first winding of the transformer 222 may be commonly connected to the first end of the plurality of resisters 221 and the first output terminal of the amplifier circuit 210, and the other or second end of the first winding may be connected to one or first end of the second switch 223. In addition, one or first end of the second winding of the transformer 222 may be connected to an anode of the diode 224, and the other or second end of the second winding may be connected to the other or second end of the third capacitor 225.

The first end of the second switch 223 may be connected to the other or second end of the first winding of the transformer 222, and the second end of the second switch 223 may be connected to the second output terminal of the amplifier circuit 210 through a resistor.

The diode 224 may rectify an output voltage of the transformer 222. For example, the anode of a diode 224 may be connected to the one or first end of the second winding of the transformer 222, and a cathode of the diode 224 may be connected to one or first end of the third capacitor 225.

The third capacitor 225 may smooth the rectified voltage. For example, the one or first end of the third capacitor 225 may be connected to the cathode of the diode 224, and the other or second end of the third capacitor 225 may be connected to the other or second end of the second winding of the transformer 222.

Voltage at both ends of the third capacitor 225 may be a first DC power, and may be connected to a configuration requiring the first DC power, among the components of the image forming device 100.

The PWM controller 226 may selectively switch control power input to the first winding of the transformer 222 in response to the output voltage. To this end, the PWM controller 226 may receive size information of the output power (i.e., the first DC power) of the third capacitor 225 from a photo-coupler (not illustrated).

In addition, the PWM controller 226 may control the second switch 223 to selectively supply the output power of the amplifier circuit 210 to the first winding of the transformer 222 based on a voltage value of an intermediate node of the plurality of resistors 221 and the size information of the output power provided form the photo-coupler. For example, the PWM controller 226 may calculate a duty ratio based on the voltage value of the intermediate nodes of the plurality of resistors 221 and the size information of the output power provided from the photo-coupler, and control the second switch 223 to perform on/off corresponding to the calculated duty ratio.

The first converter 220-1 may be provided with the plurality of resistors 221 to confirm a size of voltage input as described above. The plurality of resistors 221 may generate power consumption, and as described above, when the operating mode of the image forming device 100 is switched to the power saving mode, a size of voltage provided to the first converter 220-1 may be reduced by half, and the power consumed by the plurality of resistors 221 may be reduced to one quarter.

The second converter 220-2 is an LLC resonant converter. The second converter 220-2 may output the second DC power with a predetermined size when the operating mode of the image forming device is in a normal mode, and may not output the second DC power when the operating mode of the image forming device is in a power saving mode.

A fourth switch 241 may selectively provide AC power to the AC sensing circuit 242 and the zero-cross sensing circuit 243.

The AC sensing circuit 242 may detect whether AC power is input. For example, the AC sensing circuit 242 may be configured as a transformer and may provide AC sensing information to the controller 230.

The zero-cross sensing circuit 243 may detect a zero-cross time point of the AC power and provide information about the sensed zero-cross time point to the controller 230. The zero-cross time point may be information about a point of time when a phase of the AC power is 0 degrees or 180 degrees.

Specific operations of the controller 230 have been described with reference to FIG. 4, and only operations related to added configurations will be described below.

The controller 230 may short-circuit the fourth switch 213 when the operating mode is a normal mode, and open the fourth switch 213 when the operating mode of the image forming device 100 is a power saving mode. That is, the controller 230 may perform the AC sensing operation and the zero-cross sensing operation even when the operating mode of the image forming device is a normal mode, thereby further reducing power consumption of the image forming device 100 when the operating mode of the image forming device 100 is in a power saving mode.

When the operating mode of the image forming device 100 is a normal mode, the controller 230 may provide information on whether the AC power received from the AC sensing circuit 242 and the zero-cross sensing circuit 243 is input, and zero-cross information to the processor 120.

When receiving information that the operating mode of the image forming device 100 is changed from a normal mode to a power saving mode from the processor 120, the controller 230 may control the second converter 220-2 to not be operated, and allow the first switch 213 and the fourth switch 241 to be opened in order to change to a blocking of a sensing operation and change from double amplification to general amplification.

Meanwhile, when an initial state of the image forming device 100, that is, a power cable of the image forming device 100 is connected to an outlet for the first time, the controller 230 may open the first switch 213 to perform the general amplification operation, and open the fourth switch 241 to not perform the sensing operation.

After it becomes stable, the controller 230 may short-circuit the fourth switch 241 to perform the sensing operation, and short-circuit the first switch 213 to perform double amplification that is changed from general amplification. After that, the controller 230 may operate the second converter 220-2 so that the power supply apparatus 200 outputs the first and second DC power.

Power consumption when the power supply apparatus is implemented as in the first example is as follows.

TABLE 1

| | AC input voltage | Rectifier voltage | Efficiency of 1 W input | No-load power consumption |
|---|---|---|---|---|
| Double rectification | AC 110 V | DC 310 V | 76.1% | 62 mW |
| General rectification | AC 110 V | DC 155 V | 81.9% | 29 mW |
| Improvement effect | | | 5.6% | 33 mW |

Referring to table 1, while the 1 W input power saving mode method consumes 62 mW in the power saving mode, the first example of the disclosure by providing a controllable switch to cause a switch to general amplification consumes only 29 mW, which shows power consumption reduction effect is significant.

Figure 6:
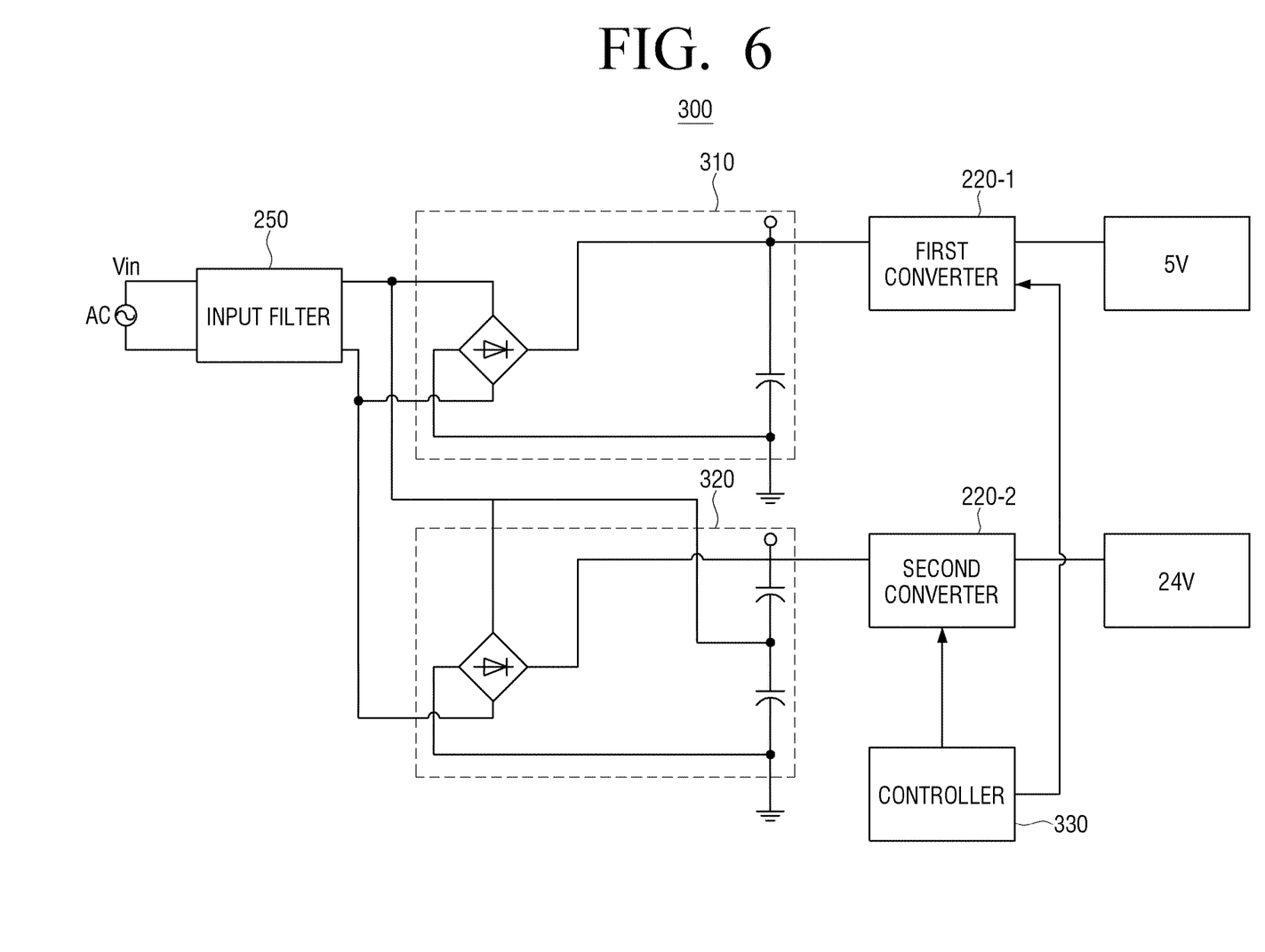
FIG. 6 is a block diagram illustrating a configuration of a power supply apparatus according to a second example.

FIG. 6 is a block diagram illustrating a configuration of a power supply apparatus according to a second example. For example, a power supply apparatus 300 according to the second example may use an amplifier circuit in which a double amplifier circuit and a general amplifier circuit are connected in parallel.

Referring to FIG. 6, the power supply apparatus 300 may include an input filter 250, a first amplifier circuit 310, a second amplifier circuit 320, a first converter 220-1, a second converter 220-3, and a controller 330.

The input filter 250 performs the same configurations and operations as the input filter 250 of FIG. 4, so further description will not be provided.

The first amplifier circuit 310 may amplify and output power output from the input filter 250. For example, the first amplifier circuit 310 may be composed of a rectifier circuit and a capacitor. The first amplifier circuit 310 performs the same operations as when the first switch 213 is opened in the amplifier circuit 210 of FIG. 4, so description of specific operation will not be provided.

The second amplifier circuit 320 may back-amplify and output the power output from the input filter 250. For example, the second amplifier circuit 320 may be composed of two capacitors connected in series with the rectifier circuit. The second amplifier circuit 320 performs the same operation as when the first switch 213 is short-circuited in the amplifier circuit 210, so description of specific operation will not be provided.

The first converter 220-1 may receive the power amplified by the first amplifier circuit 310, and output a first DC power. The first converter 220-1 may be implemented as a flyback converter, but is not limited thereto.

The second converter 220-2 may receive the power amplified by the second amplifier circuit 320 and output a second DC power. The second converter 320-2 may be implemented as an LLC resonant converter, but is not limited thereto.

The controller 330 may limit the operation of the second converter 220-2 based on an operating mode of the image forming device 100.

Hereinafter, the operation of the power supply apparatus 300 according to the operating mode of the image forming device 100 will be described separately.

When the operating mode of the image forming device 100 is the normal mode, the controller 330 may operate both the first converter 220-1 and the second converter 220-2. In this case, a general amplified power may be applied to the first converter 220-1, and a double amplified power may be applied to the second converter 220-2.

Meanwhile, when the operating mode of the image forming device 100 may be changed from the normal mode to the power saving mode, the controller 330 may stop the operation of the second converter 220-2. Accordingly, only the first converter 220-1 outputs the first DC power.

As described above, since the first converter 220-1 always uses a general amplified power which is lower than the double amplified power, the first converter 220-1 may reduce power consumption.

Figure 7:
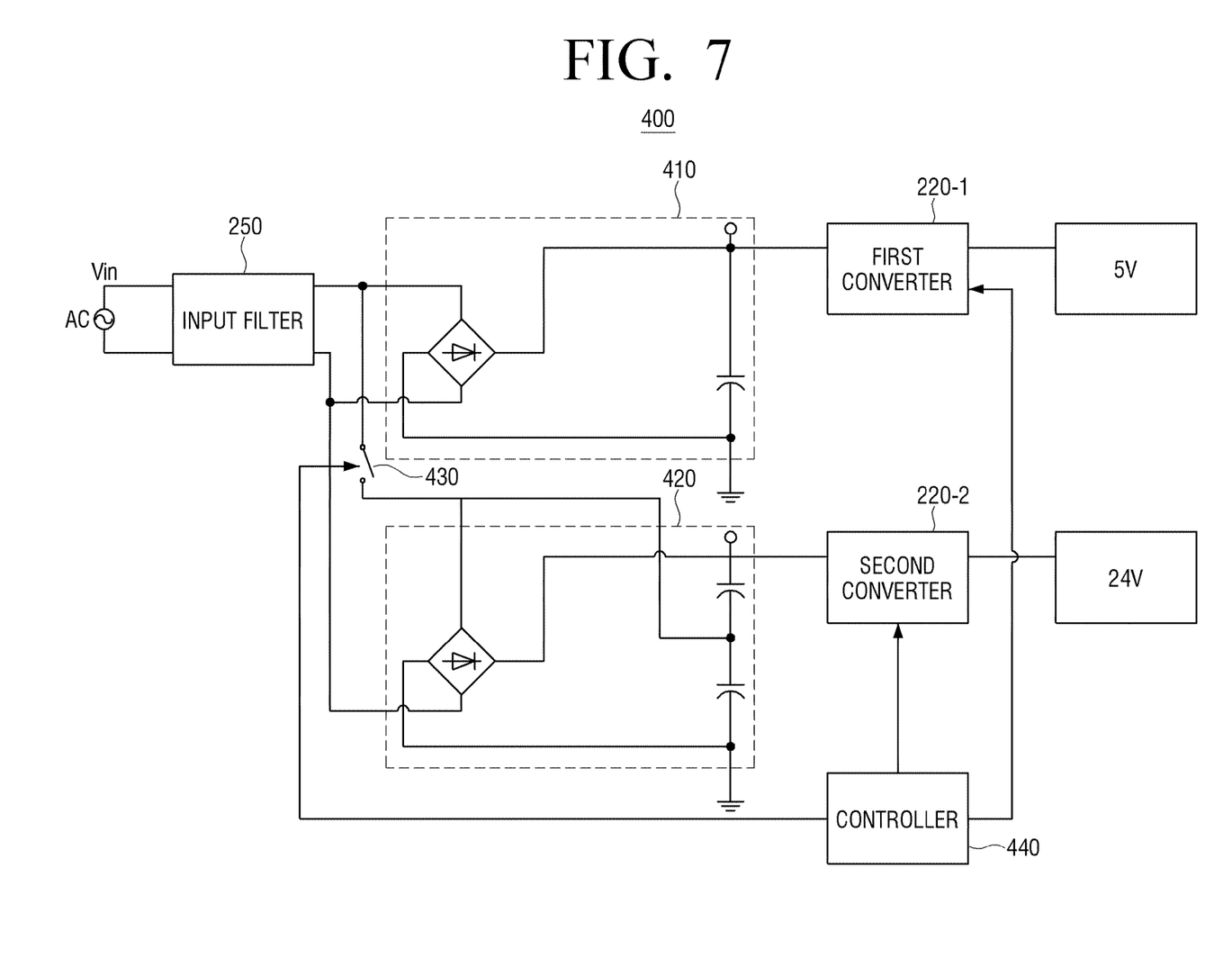
FIG. 7 is a block diagram illustrating a configuration of a power supply apparatus according to a third example.

FIG. 7 is a block diagram illustrating a configuration of a power supply apparatus according to a third example.

For example, the power supply apparatus 400 according to the third example is an example in which a third switch is added to the power supply apparatus 300 according to the second example.

Referring to FIG. 7, the power supply apparatus 400 may include an input filter 250, a first amplifier circuit 410, a second amplifier circuit 420, a third switch 430, a first converter 220-1, a second converter 220-2, and a controller 440 may be included.

Configurations of the input filter 250, the first amplifier circuit 410, the first converter 220-1, and the second converter 220-2 perform the same operation as that of FIG. 6, so repeated description will not be provided.

The third switch 430 may selectively provide the output power of the input filter 250 to the second amplifier circuit 420.

The second amplifier circuit 420 may back-amplify and output the power transmitted through the third switch 430. The second amplifier circuit 420 performs the same operation as when the first switch 213 is short-circuited in the amplifier circuit 210 of FIG. 4, and thus description of the detailed operation thereof will not be provided.

The controller 440 may control the third switch 430 based on the operating mode of the image forming device 100. For example, when the operating mode of the image forming device 100 is a normal mode, the controller 440 may short-circuit the third switch 430 so that AC power is provided to the second amplifier circuit 420, and when the operating mode of the image forming device 100 is a power saving mode, may open the third switch 430 so that the AC power is not provided to the second amplifier circuit 420.

Figure 8:
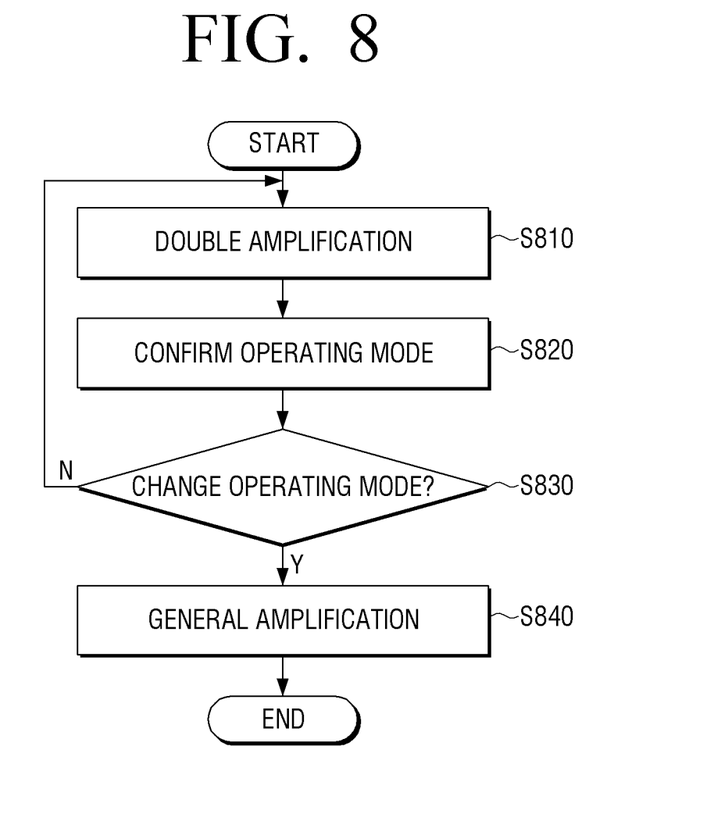
FIG. 8 is a flowchart illustrating an operation of a power supply apparatus according to a first example.

FIG. 8 is a flowchart illustrating an operation of a power supply apparatus according to a first example.

Firstly, the operation of FIG. 8 is based on the example of FIG. 5, and assumes an operating state of the image forming device 100 in a normal mode.

When the operating state of the image forming device 100 is the normal mode, the power supply apparatus 200 may be controlled to perform double amplification S810.

During this operation, the operating state of the image forming device 100 is checked S820, and if the operating state of the image forming device maintains the normal state, a current state is maintained S830-N.

When the operating state of the image forming device 100 is changed to the power saving state S830-Y, the power supply apparatus 200 may be controlled to perform general amplification. Before this operation, the power supply apparatus 200 may stop the output of the second DC power, that is, stop the operation of the second converter 220-2, and may open the first switch 213 in the amplifier circuit 210 thereafter.

Therefore, the control method of the power supply apparatus according to the example, the amplification method may be changed from the double amplification method to the general amplification method in the power saving mode, and thus, power consumption of the first converter 220-1 may be reduced. The method for controlling the power supply apparatus as illustrated in FIG. 8 may be performed on the power supply apparatus having the configuration as illustrated in FIGS. 3 to 5, and may be executed even on a power supply apparatus having another configuration.

In addition, the above-described controlling method may be realized as at least one execution program to execute the above-described controlling method, and such an execution program may be stored in a computer readable recording medium.

Accordingly, respective blocks according to the disclosure may be executed as a computer readable code on the computer readable recording medium. The computer readable recording medium may be a device that can store data that can be read by a computer system.

The foregoing examples and advantages are merely exemplary and are not to be construed as limiting the disclosure. The present teaching can be readily applied to other types of apparatuses. Also, the description of the examples of the disclosure is intended to be illustrative, and not to limit the scope of the claims, and many alternatives, modifications, and variations will be apparent to those skilled in the art.

What is claimed is:

1. A power supply apparatus to supply power to an image forming device, the power supply apparatus comprising:
an amplifier circuit to amplify an input AC power by general amplification or a double amplification;
a converter to receive the input AC power amplified by the general amplification or the double amplification and output a DC power with a determined size; and
a controller to control applying the general amplification or the double amplification to the converter, in response to an operating mode of the image forming device.

2. The power supply apparatus as claimed in claim 1, wherein the amplifier circuit comprises,
a first capacitor and a second capacitor connected in series;
a rectifier circuit in which a first input terminal of the rectifier circuit receives the amplified input AC power, and an output terminal of the rectifier circuit is connected to both first ends of the first and second capacitors; and
a switch to selectively connect intermediate nodes connected in series of the first and second capacitors to the first input terminal of the rectifier circuit, in response to the control of the controller to apply the general amplification or the double amplification.

3. The power supply apparatus as claimed in claim 2, wherein the controller is to control the first switch to short when the operating mode of the image forming device is a normal mode to cause the applying the double amplification, and to control the switch to open when the operating mode of the image forming device is a power save mode to cause the applying the general amplification.

4. The power supply apparatus as claimed in claim 2, wherein the switch is a Solid state relay (SSR) or Metal Oxide Semiconductor Field Effect Transistor (MOSFET).

5. The power supply apparatus as claimed in claim 1, wherein the output of the DC power includes a first DC power and a second DC power, and the converter comprises:
a first converter to receive the amplified input AC power by the amplifier circuit and output the first DC power with a determined size; and
a second converter to receive the input AC power amplified by the amplifier circuit and output the second DC power with a determined size greater than the first DC power.

6. The power supply apparatus as claimed in claim 5, wherein the controller is to control the second convert to stop the output of the second converter when the operating mode of the image forming device is a power saving mode.

7. The power supply apparatus as claimed in claim 5, wherein the controller is to control the second convert to stop the output of the second converter when the operating mode of the image forming device is changed from a normal mode to a power saving mode, and to control the amplifier circuit to change the applying from the double amplification to the general amplification after the operation of the second converter is stopped.

8. The power supply apparatus as claimed in claim 5, wherein the first converter comprises:
a transformer having a first winding and a second winding;
a switch to selectively supply the amplified input AC power to the first winding;
a diode in which an anode of the diode is connected to a first end of the second winding;
a capacitor in which a first end is connected to a cathode of the diode and a second end is connected to a second end of the second winding;
a plurality of resisters in which an end to the plurality of resisters is connected to a first output terminal of the amplifier circuit to distribute the amplified input AC power; and
a pulse width modulation (PWM) controller is to PMW control a turn-off operation of the switch, based on voltage values of intermediate nodes connected in series of the plurality of resisters.

9. The power supply apparatus as claimed in claim 1, wherein the amplifier circuit comprises:
a first amplifier circuit apply the general amplification on the input AC power; and
a second amplifier circuit connected to the first amplifier circuit in parallel to apply the double amplification on the input AC power,
wherein the output of the DC power includes a first DC power and a second DC power, and the converter comprises:
a first converter to receive the amplified input AC power amplified by the first amplifier circuit and output the first DC power with a determined size; and
a second converter to receive the amplified input AC power amplified by the second amplifier circuit and output the second DC power with a determined size greater than the first DC power.

10. The power supply apparatus as claimed in claim 9, wherein the controller is to control the second converter to stop the second converter when the operating mode of the image forming device is a power saving mode.

11. The power supply apparatus as claimed in claim 9, further comprising a switch to selectively supply the input AC power to the second amplifier circuit, and
wherein the controller is to control the switch to short when the operating mode of the image forming device is a normal mode to cause the applying the double amplification, and to control the switch to open when the operating mode of the image forming device is a power saving mode to cause the applying the general amplification.

12. The power supply apparatus as claimed in claim 1, further comprising:
an AC sensing circuit to sense the input AC power;
a zero-cross sensing circuit to sense a zero-cross time point of the input AC power; and
a switch to selectively supply the input AC power to the AC sensing circuit and the zero-cross sensing circuit,
wherein the controller is to control the switch to short when the operating mode of the image forming device is a normal mode to cause the applying the double amplification, and to control the switch to open when the operating mode of the image forming device is a power saving mode to cause the applying the general amplification.

13. An image forming device, comprising:
a print engine to form an image;
a processor to control the print engine to print the image; and
a power supply apparatus to supply a first DC power to the processor and to supply a second DC power greater than the first power to the print engine,
wherein the power supply apparatus is to generate at least one of the first DC power by a general amplification, or the second DC power by a double amplification with respect to input AC power when the operating mode of the image forming device is a normal mode, and to generate only the first DC power by the general amplification when the operating mode of the image forming device is a power saving mode.

14. The image forming device as claimed in claim 13, wherein the power supply apparatus comprises an amplifier circuit to apply the general amplification with respect to input AC power when the operating mode of the image forming device is a power saving mode, and apply the double amplification with respect to the input AC power when the operating mode of the image forming device being a normal mode.

15. The image forming device as claimed in claim 13, wherein the processor is to determine the operating mode of the image forming device and supply the determined operating mode to the power supply apparatus.

* * * * *